United States Patent
Heschl et al.

(10) Patent No.: US 10,763,783 B2
(45) Date of Patent: Sep. 1, 2020

(54) BANDWIDTH ADJUSTMENT IN A PHASE-LOCKED LOOP OF A LOCAL OSCILLATOR

(71) Applicant: Infineon Technologies AG, Neubiberg (DE)

(72) Inventors: Lukas Heschl, Linz (AT); Rainer Stuhlberger, Puchenau (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/378,046

(22) Filed: Apr. 8, 2019

(65) Prior Publication Data

US 2019/0319582 A1   Oct. 17, 2019

(30) Foreign Application Priority Data

Apr. 17, 2018  (DE) .................. 10 2018 109 081

(51) Int. Cl.
| | |
|---|---|
| *H03B 5/12* | (2006.01) |
| *H03L 7/08* | (2006.01) |
| *H03L 7/099* | (2006.01) |
| *H03L 7/089* | (2006.01) |
| *H03L 7/189* | (2006.01) |

(52) U.S. Cl.
CPC ......... *H03B 5/1243* (2013.01); *H03B 5/1265* (2013.01); *H03L 7/0805* (2013.01); *H03L 7/0893* (2013.01); *H03L 7/0996* (2013.01); *H03L 7/189* (2013.01); *H03B 2201/0266* (2013.01); *H03L 2207/06* (2013.01)

(58) Field of Classification Search
CPC .................................................. H03B 5/1243
USPC ................................................... 331/16
See application file for complete search history.

(56) References Cited

U.S. PATENT DOCUMENTS

| | | | | |
|---|---|---|---|---|
| 2012/0082151 A1* | 4/2012 | Liu | ............ | H03L 7/093 370/342 |
| 2012/0268178 A1* | 10/2012 | Reddy | ............ | H03F 3/45179 327/157 |
| 2013/0076450 A1* | 3/2013 | Rao | ............ | H03L 7/0896 331/34 |
| 2018/0097521 A1 | 4/2018 | Hammerschmidt et al. | | |

(Continued)

*Primary Examiner* — Joseph Chang
(74) *Attorney, Agent, or Firm* — Harrity & Harrity, LLP

(57) ABSTRACT

A method for a radar device is described. According to one example implementation, the method comprises generating an RF signal using a voltage-controlled oscillator (VCO), wherein the frequency of the RF signal depends on a first tuning voltage and a second tuning voltage. The method also comprises setting the second tuning voltage using a phase-locked loop coupled to the VCO, with the result that the frequency of the RF signal corresponds to a desired frequency. The first tuning voltage is changed in such a manner that the second tuning voltage set by the phase-locked loop corresponds approximately to a predefined value. Another example implementation relates to a method for a radar device comprising: generating an RF signal using a VCO, wherein the frequency of the RF signal depends on a tuning voltage, setting the tuning voltage using a phase-locked loop coupled to the VCO, with the result that the frequency of the RF signal corresponds to a desired frequency, and determining a differential VCO gain of the VCO. The bandwidth of the phase-locked loop is set on the basis of the determined VCO gain.

20 Claims, 7 Drawing Sheets

(56) References Cited

U.S. PATENT DOCUMENTS

2018/0191302 A1\* 7/2018 Saric ................... H03C 3/0941
2018/0191359 A1\* 7/2018 Petrov .................... H02M 3/07

\* cited by examiner

BANDWIDTH ADJUSTMENT IN A PHASE-LOCKED LOOP OF A LOCAL OSCILLATOR

RELATED APPLICATION

This application claims priority under 35 U.S.C. § 119 to German Patent Application No. 102018109081.1, filed on Apr. 17, 2018, the contents of which are incorporated by reference herein in their entirety.

TECHNICAL FIELD

The present description relates to the field of radar sensors, in particular to a phase-locked loop having a voltage-controlled oscillator (VCO) for generating a radio-frequency (RF) oscillator signal.

BACKGROUND

Radio-frequency (RF) transmitters and receivers are found in a multiplicity of applications, in particular in the field of wireless communication and radar sensors. In the automotive sector, there is an increasing need for radar sensors which can be used, inter alia, in driving assistance systems (Advanced driver assistance systems, ADAS), for example in adaptive cruise control (ACC or Radar Cruise Control) systems. Such systems can automatically adapt the speed of an automobile in order to thus maintain a safe distance to other automobiles traveling in front (and from other objects and pedestrians). Further applications in the automotive sector are, for example, blind spot detection, lane change assist and the like.

Modern radar systems use highly integrated RF circuits which can contain all core functions of an RF front-end of a radar transceiver in a single chip housing (Single-Chip Transceiver). Such RF front-ends may have, inter alia, an RF local oscillator (LO), power amplifiers, low-noise amplifiers (LNA) or mixers.

Frequency-modulated continuous-wave (FMCW) radar systems use radar signals containing sequences of so-called chirps. In order to produce such chirps, the radar device may have a local oscillator which has a VCO arranged in a phase-locked loop (PLL). The frequency of the VCO is set using a control voltage which can be tuned by adjusting the frequency division ratio of a frequency divider in the feedback loop of the PLL. In order to keep the phase noise of the local oscillator output signal low, the bandwidth of the PLL should be low. However, a low bandwidth goes against generating highly linear chirp signals with steep frequency ramps.

SUMMARY

A method for a radar device is described. According to one example implementation, the method comprises generating an RF signal using a voltage-controlled oscillator (VCO), wherein the frequency of the RF signal depends on a first tuning voltage and a second tuning voltage. The method also comprises setting the second tuning voltage using a phase-locked loop coupled to the VCO, with the result that the frequency of the RF signal corresponds to a desired frequency. The first tuning voltage is changed in such a manner that the second tuning voltage set by the phase-locked loop corresponds approximately to a predefined value.

Another example implementation relates to a method for a radar device, comprising: generating an RF signal using a VCO, wherein the frequency of the RF signal depends on a tuning voltage, setting the tuning voltage using a phase-locked loop coupled to the VCO, with the result that the frequency of the RF signal corresponds to a desired frequency, and determining a differential VCO gain of the VCO. The bandwidth of the phase-locked loop is set on the basis of the determined VCO gain.

An RF oscillator circuit is also described. According to one example implementation, the RF oscillator circuit has a VCO and a phase-locked loop which is coupled to the VCO. The VCO is designed to generate an RF signal, wherein the frequency of the RF signal depends on a first tuning voltage and a second tuning voltage. The phase-locked loop is designed to set the second tuning voltage in such a manner that the frequency of the RF signal corresponds to a desired frequency. A control circuit is designed to set the first tuning voltage in such a manner that the second tuning voltage set by the phase-locked loop corresponds approximately to a predefined value.

Another example implementation relates to an RF oscillator circuit having a VCO and a phase-locked loop which is coupled to the VCO. The VCO is designed to generate an RF signal, wherein the frequency of the RF signal depends on a tuning voltage, and the phase-locked loop is designed to set the tuning voltage in such a manner that the frequency of the RF signal corresponds to a desired frequency. A control circuit is coupled to the phase-locked loop and is designed to determine a differential VCO gain of the VCO and to set the bandwidth of the phase-locked loop on the basis thereof.

BRIEF DESCRIPTION OF THE DRAWINGS

Example implementations are explained in more detail below on the basis of figures. The illustrations are not necessarily true to scale and the example implementations are not only restricted to the aspects illustrated. Rather, importance is placed on illustrating the principles on which the example implementations are based. In the figures.

DETAILED DESCRIPTION

Figure 1:
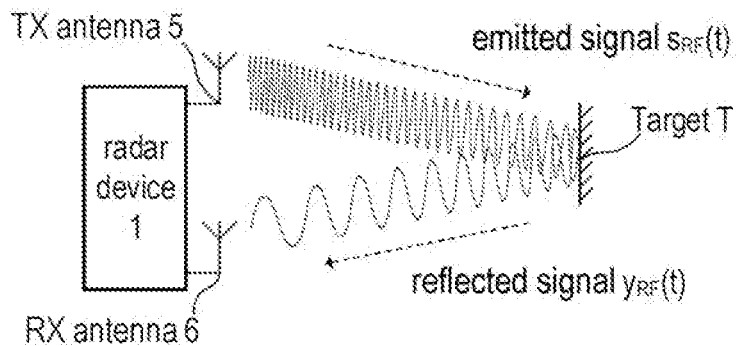
FIG. 1 is a sketch for illustrating the functional principle of an FMCW radar system for measuring distance and/or speed.

FIG. 1 illustrates a schematic diagram of the use of an FMCW radar system as a sensor for measuring distances and speeds of objects which are usually referred to as radar targets. In the present example, the radar device 1 has separate transmitting (TX) and receiving (RX) antennas 5 and 6 (bistatic or pseudo-monostatic radar configuration). However, it is noted that it is also possible to use a single antenna which is simultaneously used as a transmitting antenna and a receiving antenna (monostatic radar configuration). The transmitting antenna 5 emits a continuous RF signal $s_{RF}(t)$ which is frequency-modulated, for example, with a type of sawtooth signal (periodic, linear frequency ramp). The emitted signal $s_{RF}(t)$ is scattered back at the radar target T and the backscattered/reflected signal $y_{RF}(t)$ is received by the receiving antenna 6. FIG. 1 shows a simplified example; in practice, radar sensors are systems having a plurality of transmitting (TX) and receiving (RX) channels in order to also be able to determine the angle of incidence (direction of arrival, DoA) of the backscattered/reflected signal $y_{RF}(t)$ and therefore locate the radar target T more accurately.

Figure 2:
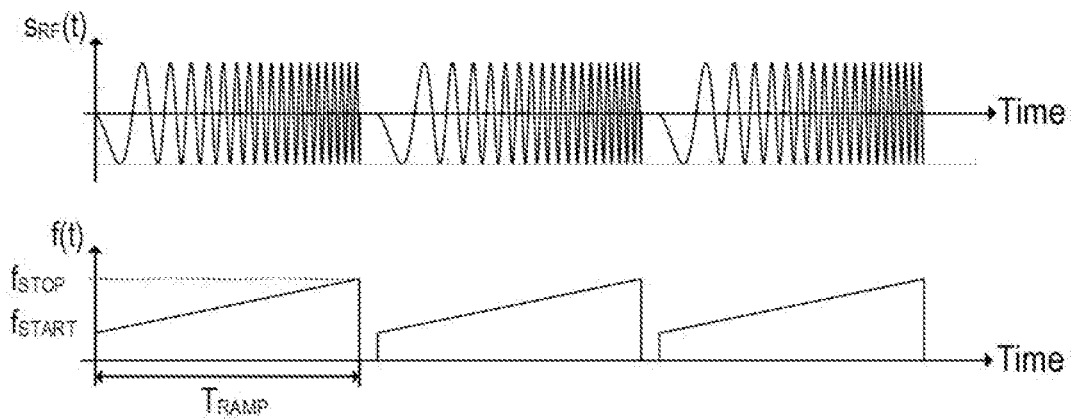
FIG. 2 comprises two timing diagrams for illustrating the frequency modulation (FM) of the RF signal generated by the FMCW system.

FIG. 2 illustrates, by way of example, the mentioned frequency modulation of the signal $s_{RF}(t)$. As illustrated in FIG. 2 (upper graph), the emitted RF signal $s_{RF}(t)$ is composed of a set of "chirps", that is to say the signal $s_{RF}(t)$ comprises a sequence of sinusoidal signal waveforms with increasing frequency (up-chirp) or falling frequency (down-chirp). In the present example, the instantaneous frequency f(t) of a chirp, beginning at a starting frequency $f_{START}$, rises linearly to a stop frequency $f_{STOP}$ within a period $T_{RAMP}$ (see lower graph in FIG. 2). Such chirps are also referred to as linear frequency ramps. Three identical linear frequency ramps are illustrated in FIG. 2. However, it is noted that the parameters $f_{START}$, $f_{STOP}$, $T_{RAMP}$ and the pause between the individual frequency ramps can vary. The frequency variation also need not necessarily be linear (linear chirp). Depending on the implementation, transmission signals with exponential or hyperbolic frequency variation (exponential or hyperbolic chirps) can also be used, for example.

Figure 3:
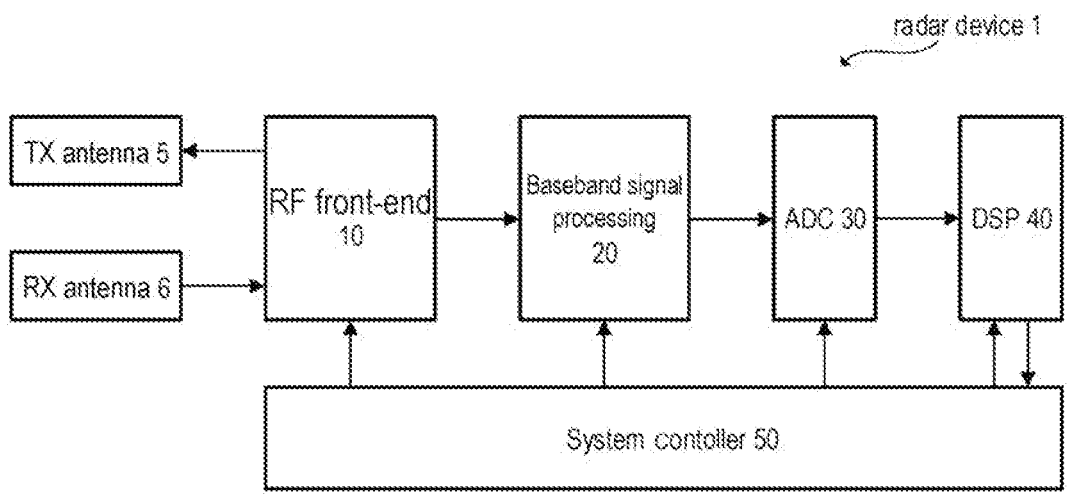
FIG. 3 is a block diagram for illustrating the fundamental structure of an FMCW radar system.

FIG. 3 is a block diagram which illustrates, by way of example, a possible structure of a radar device 1 (radar sensor). Accordingly, at least one transmitting antenna 5 (TX antenna) and at least one receiving antenna 6 (RX antenna) are connected to an RF front-end 10 which is integrated in a chip and can comprise all of those circuit components which are used for the RF signal processing. These circuit components comprise, for example, a local oscillator (LO), RF power amplifiers, low-noise amplifiers (LNA), directional couplers (for example rat-race couplers, circulators, etc.) and mixers for down-mixing (down-conversion) the RF signals to the baseband or to an intermediate frequency band (IF band). The RF front-end 10—possibly together with further circuit components—can be integrated in a chip which is usually referred to as a monolithically microwave integrated circuit (MMIC).

The illustrated example shows a bistatic (or pseudo-monostatic) radar system having separate RX and TX antennas. In the case of a monostatic radar system, a single antenna would be used both to emit and to receive the electromagnetic (radar) signals. In this case, a directional coupler (for example a circulator) can be used to separate the RF signals to be emitted from the received RF signals (radar echo signals). As mentioned, radar systems usually in practice have a plurality of transmitting and receiving channels (TX/RX channels) having a plurality of TX and RX antennas, which makes it possible, inter alia, to measure the direction (DoA) from which the radar echoes are received. In such MIMO systems, the individual TX channels and RX channels usually each have an identical or similar structure.

In the case of an FMCW radar system, the RF signals emitted via the TX antenna 5 may be, for example, in the range of approximately 20 GHz to 100 GHz (for example around 77 GHz in some applications). As mentioned, the RF signal received by the RX antenna 6 comprises the radar echoes (chirp echo signals), that is to say those signal components which are scattered back at one or more radar targets. The received RF signal $y_{RF}(t)$ is down-mixed to the baseband (or an IF band), for example, and is processed further in the baseband using analog signal processing (see FIG. 3, analog baseband signal processing chain 20). Said analog signal processing comprises substantially filtering and possibly amplification of the baseband signal. The baseband signal is finally digitized (see FIG. 3, analog/digital converter 30) and is processed further in the digital section. The digital signal processing chain can be at least partially in the form of software which can be executed on a processor, for example a microcontroller or a digital signal processor (see FIG. 3, DSP 40). The overall system is generally controlled using a system controller 50 (also referred to herein as a control circuit) which may likewise be at least partially implemented as software which can be executed on a processor, for example a microcontroller. The RF front-end 10 and the analog baseband signal processing chain 20 (optionally also the analog/digital converter 30) can be integrated together in a single MMIC (that is to say an RF semiconductor chip). Alternatively, the individual components can also be distributed among a plurality of integrated circuits.

Figure 4:
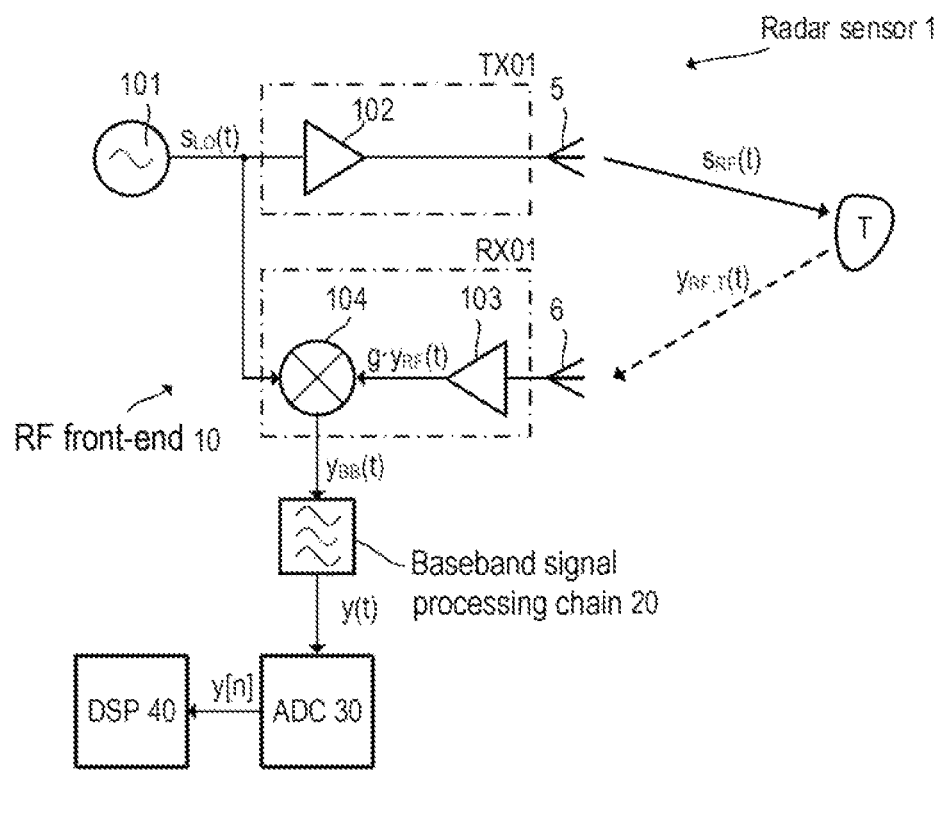
FIG. 4 is a block diagram for illustrating an example of an integrated RF front-end circuit of a radar chip including analog baseband signal processing.

FIG. 4 illustrates an example implementation of a radar device 1 according to the example from FIG. 3 in more detail. In the present example, the RF front-end 10 of the radar device 1 and the subsequent signal processing in the baseband are illustrated, in particular. It is noted that FIG. 4 illustrates a simplified circuit diagram in order to show the fundamental structure of the RF front-end 10 with a TX channel and an RX channel. Actual implementations which can depend greatly on the specific application may naturally be more complex and generally have a plurality of TX and/or RX channels.

The RF front-end 10 comprises a local oscillator 101 (LO) which generates an RF oscillator signal $s_{LO}(t)$. The RF oscillator signal $s_{LO}(t)$ is frequency-modulated during radar operation, as described above with reference to FIG. 2, and is also referred to as an LO signal. In radar applications, the frequency $f_{LO}$ of the LO signal $s_{LO}(t)$ is usually in the SHF (Super High Frequency, centimeter wave) or in the EHF (Extremely High Frequency, millimeter wave) band, for example in the range of 76 GHz to 81 GHz in some automotive applications. The LO signal $s_{LO}(t)$ is processed both in the transmission signal path TX01 (in the TX channel) and in the reception signal path RX01 (in the RX channel). The local oscillator 101 usually comprises a VCO (also see FIG. 5) which is connected in a phase-locked loop (PLL).

The transmission signal $s_{RF}(t)$ (cf. FIG. 2) which is emitted by the TX antenna 5 is generated by amplifying the LO signal $s_{LO}(t)$, for example using the RF power amplifier 102, and is therefore merely an amplified version of the LO signal $s_{LO}(t)$. The output of the amplifier 102 can be coupled to the TX antenna 5 (in the case of a bistatic or pseudo-monostatic radar configuration). The reception signal $y_{RF}(t)$ which is received by the RX antenna 6 is supplied to the receiver circuit in the RX channel and is therefore supplied directly or indirectly to the RF port of the mixer 104. In the present example, the RF reception signal $y_{RF}(t)$ (antenna signal) is pre-amplified using the amplifier 103 (gain g). The mixer 104 therefore receives the amplified RF reception signal $g \cdot y_{RF}(t)$. The amplifier 103 may be an LNA, for example. The LO signal $s_{LO}(t)$ is supplied to the reference port of the mixer 104, with the result that the mixer 104 down-mixes the (pre-amplified) RF reception signal $y_{RF}(t)$ to the baseband. The down-mixed baseband signal (mixer output signal) is denoted $y_{BB}(t)$. This baseband signal $y_{BB}(t)$ is first of all further processed in analog form, wherein the analog baseband signal processing chain 20 substantially effects amplification and (for example bandpass or low-pass) filtering in order to suppress undesirable sidebands and image frequencies. The resulting analog output signal which is supplied to an analog/digital converter (see FIG. 3, ADC 30) is denoted y(t). Methods for the digital further processing of the digitized output signal (digital radar signal y[n]) for detecting radar targets are known per se (for example the range-Doppler analysis) and are therefore not discussed any further here.

In the present example, the mixer 104 down-mixes the pre-amplified RF reception signal $g \cdot y_{RF}(t)$ (that is to say the amplified antenna signal) to the baseband. The mixing can be carried out in one stage (that is to say from the RF band directly to the baseband) or via one or more intermediate stages (that is to say from the RF band to an intermediate frequency band and then to the baseband). In this case, the reception mixer 104 effectively comprises a plurality of individual mixer stages connected in series. In view of the example shown in FIG. 4, it becomes clear that the quality of a radar measurement is determined greatly by the quality of the LO signal $s_{LO}(t)$, inter alia by the noise contained in the LO signal $s_{LO}(t)$. This noise is quantitatively determined by the phase noise of the local oscillator 101 and the bandwidth of the phase-locked loop.

Figure 5:
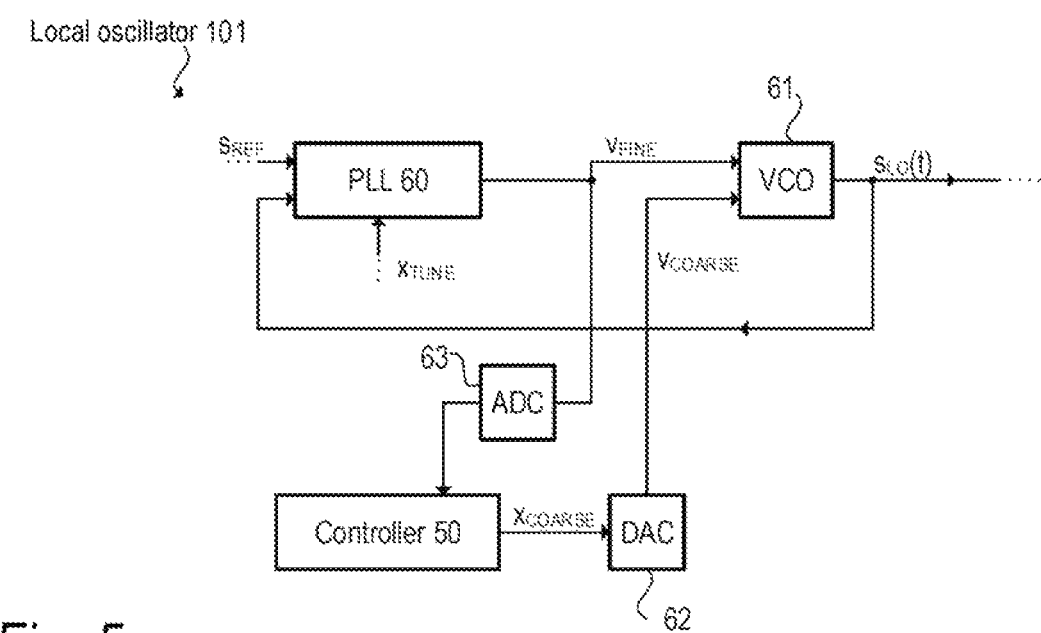
FIG. 5 is a block diagram for illustrating a first example of a local oscillator having a VCO connected in a phase-locked loop.

FIG. 5 shows a block diagram of an example implementation of a local oscillator which can be used, for example, in the RF front-end 10 from FIG. 4. According to FIG. 5, the local oscillator 101 comprises a VCO 61 which is designed to generate an RF oscillator signal $s_{LO}(t)$ (that is to say the LO signal), the frequency $f_{LO}$ of which depends on one or more input voltages (tuning voltages). The frequency $f_{LO}$ is usually a non-linear function of the input voltage(s). In the example illustrated, the VCO 61 has two inputs for supplying a first voltage $V_{COARSE}$ for coarse tuning and a second voltage $V_{FINE}$ for fine tuning the VCO 61. In the example illustrated, the first voltage $V_{COARSE}$ (coarse tuning voltage) is generated by a digital/analog converter 62 in accordance with a digital word $X_{COARSE}$, whereas the second voltage $V_{FINE}$ (fine tuning voltage) is output by the phase-locked loop 60 (PLL).

An associated VCO gain $f_{LO}/V_{FINE}$ and $f_{LO}/V_{COARSE}$ can be defined for each of the input voltages $V_{FINE}$, $V_{COARSE}$. The derivatives $\partial f_{LO}/\partial V_{FINE}$ and $\partial f_{LO}/\partial V_{COARSE}$ are referred to as differential VCO gains. In the following discussion, the ratio $f_{LO}/V_{COARSE}$ is referred to as the VCO gain $K_{VCO}$ and the derivative $\partial f_{LO}/\partial V_{FINE}$ is referred to as the differential VCO gain $k_{VCO}$. Both values $K_{VCO}$ and $k_{VCO}$ are generally frequency-dependent. Furthermore, the VCO gain $K_{VCO}$ and the differential VCO gain $k_{VCO}$ are temperature-dependent and can also be influenced by ageing effects.

Figure 6:
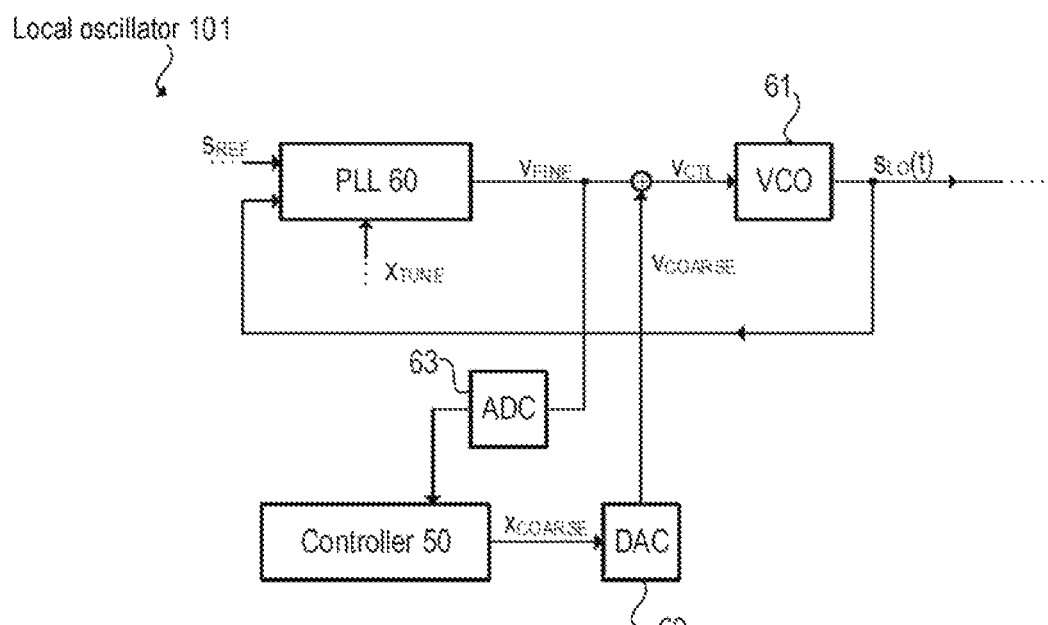
FIG. 6 is a block diagram for illustrating a second example of a local oscillator having a VCO connected in a phase-locked loop.

The VCO 61 used in the example from FIG. 5 therefore has two VCO gains $f_{LO}/V_{COARSE}$ and $f_{LO}/V_{FINE}$. In this example, the VCO 61 comprises two different varactor diodes, the characteristic curves of which determine the VCO gains. FIG. 6 illustrates another example of a local oscillator 101 having a phase-locked loop 60. Unlike in the previous example, the VCO 61 in the present example has only one input which is supplied with the voltage $V_{CTL}$ which corresponds to the sum $V_{COARSE}+V_{FINE}$. In this case, the VCO has only one VCO gain $f_{LO}/V_{CTL}$. For the corresponding differential VCO gain $\partial f_{LO}/\partial V_{CTL}$, the following applies: $k_{VCO}=\partial f_{LO}/\partial V_{CTL}=\partial f_{LO}/\partial V_{FINE}=\partial f_{LO}/\partial V_{COARSE}$. Apart from the implementation of the VCO, the example from FIG. 6 is identical to the previous example from FIG. 5 and reference is made to the description above.

In the examples from FIGS. 5 and 6, the desired value for the frequency $f_{LO}$ is set, on the one hand, by the frequency $f_{REF}$ of a reference signal $s_{REF}(t)$ and, on the other hand, by adjusting the division ratio of a frequency divider in the feedback path of the phase-locked loop 60, wherein this division ratio can be adjusted on the basis of the digital signal $X_{TUNE}$. This mechanism is explained in yet more detail below with reference to FIG. 8. The digital signal $X_{COARSE}$ which is supplied to the DAC 62 can be provided, for example, by the system controller 50 (cf. FIG. 3) or another controller circuit. The phase-locked loop 60 is designed to set the fine tuning voltage $V_{FINE}$ in such a manner that the frequency $f_{LO}$ of the LO signal $s_{LO}(t)$ corresponds to the desired value (dependent on the digital signal $x_{TUNE}$). The fine tuning voltage $V_{FINE}$ can be varied only in a particular range (for example 0 to 3 V). The size of this range depends on the implementation of the VCO 61 and the phase-locked loop 60. In accordance with the (frequency-dependent) differential VCO gain $k_{VCO}=\partial f_{LO}/\partial V_{FINE}$, this range corresponds to a frequency range of, for example, 1500 MHz (frequency ramps above 200 MHz-4000 MHz, for example, are also possible) within which the frequency $f_{LO}$ of the LO signal $s_{LO}(t)$ can be adjusted by varying the fine tuning voltage $V_{FINE}$. That is to say, the frequency $f_{LO}$ of the LO signal $s_{LO}(t)$ can be fine tuned, for example, in the range of 76 GHz to 77.5 GHz (with a suitable setting of the coarse tuning voltage $V_{COARSE}$). If a different tuning range is desired (for example 79 GHz to 80.4 GHz), the coarse tuning voltage $V_{COARSE}$ can be adjusted. The stated numerical values are used only for illustration and are greatly dependent on the actual implementation.

As mentioned, the VCO gain $K_{VCO}$ is also temperature-dependent. In order to generate a particular sequence of frequency ramps (chirps) with a starting frequency $f_1$ and a stop frequency $f_2$, the coarse tuning voltage $V_{COARSE}$ can first of all be set and the frequency $f_{LO}$ can then be modulated by changing the fine tuning voltage $V_{FINE}$ from a first value $V_{FINE}=V_1$ to a second value $V_{FINE}=V_2$. The latter is achieved with the aid of the phase-locked loop. The frequency $f_{LO}$ generated by the VCO 61 changes from the starting frequency $f_1$ to the stop frequency $f_2$ in this case.

During coarse tuning of the VCO, the temperature dependence of the VCO gain $K_{VCO}$ can be taken into account in order to ensure that the voltage range from $V_1$ to $V_2$ which is needed for a desired frequency ramp (from $f_1$ to $f_2$) does not leave the range (for example 0 to 3 V) within which the voltage $V_{FINE}$ can be varied. For example, for a given value of the coarse tuning voltage $V_{COARSE}$ and a desired frequency ramp (for example $f_1=76$ GHz and $f_2=77.5$ GHz) it may be useful to vary the fine tuning voltage $V_{FINE}$ from $V_1=0.6$ V to $V_2=2.7$ V. $V_1$ and $V_2$ may shift by 0.5 V, for example, as a result of a temperature change. However, the voltage value $V_2=2.7V+0.5V$ is outside the fine tuning range. Consequently, it is useful to adjust the coarse tuning voltage $V_{COARSE}$.

In order to avoid adjustment of the coarse tuning voltage $V_{COARSE}$ during operation, the coarse tuning can be carried out in such a manner that the fine tuning voltage $V_{FINE}$ corresponds to a predefined desired value for the starting frequency $f_1$ of a frequency ramp. In the case of a frequency ramp with a rising frequency (up-chirp), the coarse tuning voltage $V_{COARSE}$ can be varied, for example, during a tuning phase until the fine tuning voltage $V_{FINE}$ corresponds to a defined desired value of, for example, $V_1=0.6$ V. In this case, the fine tuning voltage $V_{FINE}$ can be measured using an ADC 63 and the resulting digital value can be supplied to the controller 50. In the case of a frequency ramp with a falling frequency, the desired value for the fine tuning voltage $V_{FINE}$ may be higher, for example $V_2=2.4$ V.

Figure 7:
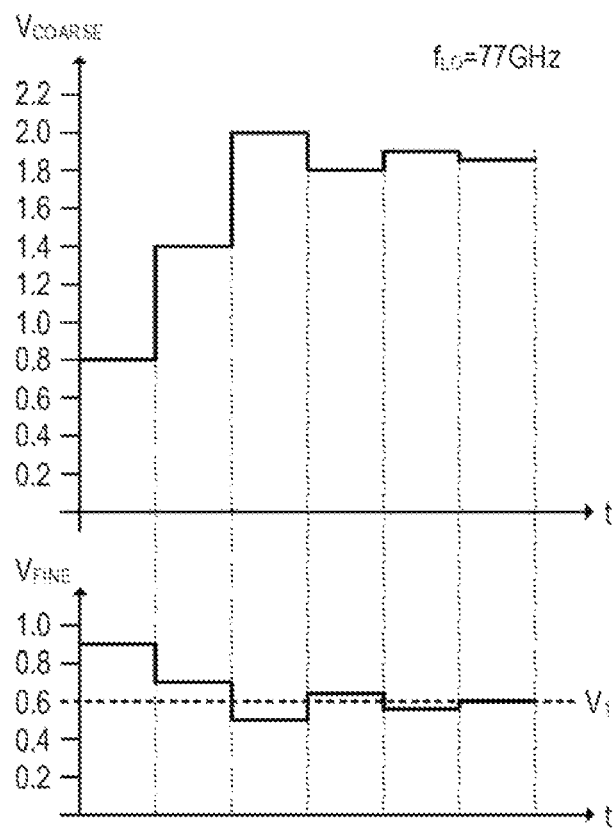
FIG. 7 shows an example timing diagram of a concept for iteratively setting the voltage for the coarse tuning of the VCO.

The coarse tuning voltage $V_{COARSE}$ can be varied, for example, using known iteration methods, for example using successive approximation (see FIG. 7). The phase-locked loop 60 is active while the coarse tuning voltage $V_{COARSE}$ is being iteratively adjusted; the phase-locked loop 60 adjusts the fine tuning voltage $V_{FINE}$, with the result that the LO frequency $f_{LO}$ remains substantially constant during this tuning phase (apart from short transient variations).

According to the example illustrated in FIG. 7, the voltage $V_{COARSE}$ is first of all set to a starting value of 0.8 V, for example. The phase-locked loop 60 then regulates the voltage $V_{FINE}$ to a value (for example 0.9 V), with the result that the frequency $f_{LO}$ corresponds to the desired frequency $f_1$. This value of the voltage $V_{FINE}$ is greater than the desired value $V_1$, which is why the voltage $V_{COARSE}$ is gradually increased. On account of the feedback in the phase-locked loop, the voltage $V_{FINE}$ thereby falls below the desired value $V_1$, which is why the voltage $V_{COARSE}$ is reduced again (by a reduced voltage swing) until the voltage $V_{FINE}$ rises above the desired value $V_1$ again etc. The voltage $V_{FINE}$ therefore gradually approaches the desired value $V_1$. The associated coarse tuning voltage $V_{COARSE}$ "automatically" emerges as the result of the successive approximation. At the end of the tuning phase, $V_{FINE} \approx V_1$, wherein the desired value $V_1$ no longer depends (or depends only very weakly) on the temperature. The temperature dependence and other cross-sensitivities are compensated for by the iterative adjustment of the coarse tuning voltage $V_{COARSE}$.

Figure 8:
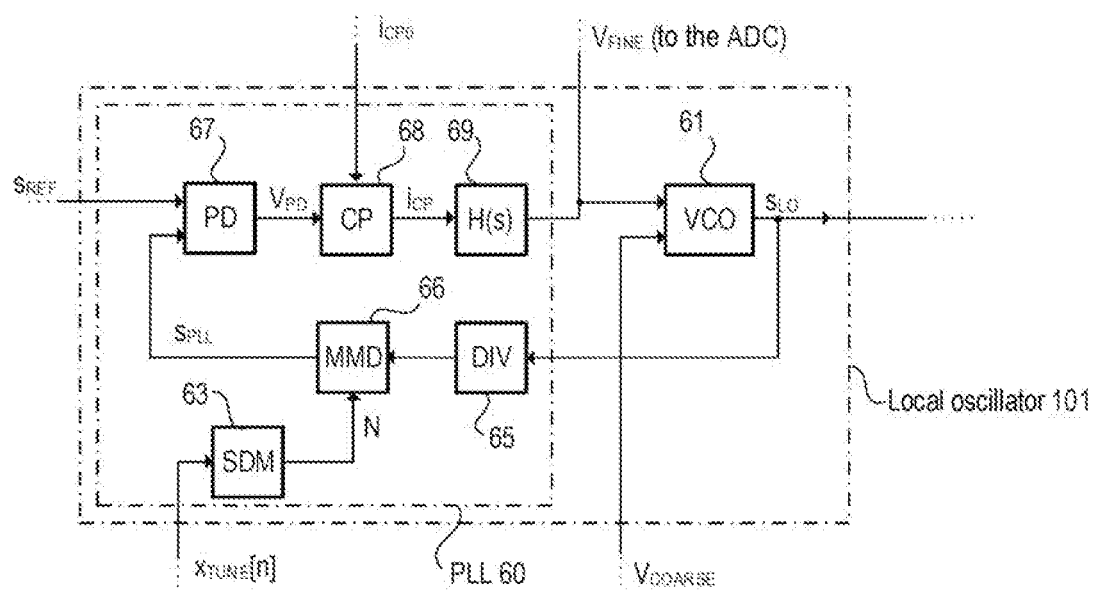
FIG. 8 illustrates an example implementation of the phase-locked loop from FIG. 5 in more detail, wherein the bandwidth of the phase-locked loop can be set by changing the absolute value of the output current of the charge pump.

FIG. 8 shows an example of an implementation of the phase-locked loop 60 (PLL) in more detail. In the example illustrated, the phase-locked loop comprises a frequency divider 65 with a fixed division ratio M and a multi-modulus divider 66 (MMD) with a settable (integer) division ratio N. The overall division ratio is therefore N·M. This division ratio N can be varied, for example, using a sigma-delta modulator 63, with the result that a non-integer division ratio R is effectively achieved and is substantially determined by the digital signal $X_{TUNE}$ which is supplied to the sigma-delta modulator 63 as an input signal. The combination of a multi-modulus divider 66 and a sigma-delta modulator 63 is known per se as a "fractional-N divider" and is therefore not explained in more detail here. It is noted at this point that the frequency divider 65 with the fixed division ratio is optional (that is to say the fixed division ratio M may be 1). Furthermore, the sequence of the frequency dividers 65 and 66 can be swapped. In the example illustrated, the output signal from the MMD 66 is denoted $s_{PLL}(t)$. This output signal $s_{PLL}(t)$ has a frequency $f_{PLL}$, and the ratio $f_{LO}/f_{PLL}$ corresponds to the effective division ratio $R=M\cdot x_{TUNE}[n]$ of the two frequency dividers 65 and 66. The frequency $f_{PLL}$ is compared, in a phase frequency detector 67, with the frequency $f_{REF}$ of a reference signal $s_{REF}(t)$ (clock signal). The output signal $V_{PD}$ from the phase frequency detector 67 depends on the comparison result and controls a charge pump 68, the output current $i_{CP}$ of which depends on whether the frequency and phase of the signal $s_{PLL}(t)$ and of the reference signal $s_{REF}(t)$ differ from one another. The output current $i_{CP}$ is supplied to the so-called loop filter 69 which finally provides the fine tuning voltage $V_{FINE}$ in accordance with a transfer function H(s). The structure and the method of operation of the one phase-locked loop for generating a frequency-modulated RF signal are known per se and are therefore not explained in any more detail here. However, unlike in other implementations, the bandwidth of the phase-locked loop can be changed, for example by changing the absolute value of the output current $i_{CP}$ of the charge pump 68.

For the following discussion, the coarse tuning voltage $V_{COARSE}$ is assumed to be constant and the differential VCO gain $k_{VCO}$ is defined as $\partial f_{LO}/\partial V_{FINE}$. The open-loop transfer function L(s) of the phase-locked loop 60 can be stated as follows:

$$L(s) = \frac{1}{s} \frac{k_{VCO} \cdot i_{CP0}}{R} H(s) \quad (1)$$

where $i_{CP0}$ is a parameter of the charge pump 68 which determines the output current $i_{CP}$. For example, depending on the output signal from the phase frequency detector 67, the output current $i_{CP}$ may be equal to $+i_{CP0}$ or $-i_{CP0}$ (cf. FIG. 9). In this case, $i_{CP0}$ is the absolute value of the charge pump output current.

The closed-loop transfer function G(s) of the phase-locked loop 60 can be calculated as follows:

$$G(s) = \frac{L(s)}{1+L(s)}. \quad (2)$$

The bandwidth of the closed-loop transfer function G(s) depends, on the one hand, on the parameters $k_{VCO}$ (differential VCO gain), $i_{CP0}$ (absolute value of the charge pump output current) and R (real division ratio) and on the transfer function H(s) of the loop filter 69.

Figure 9:
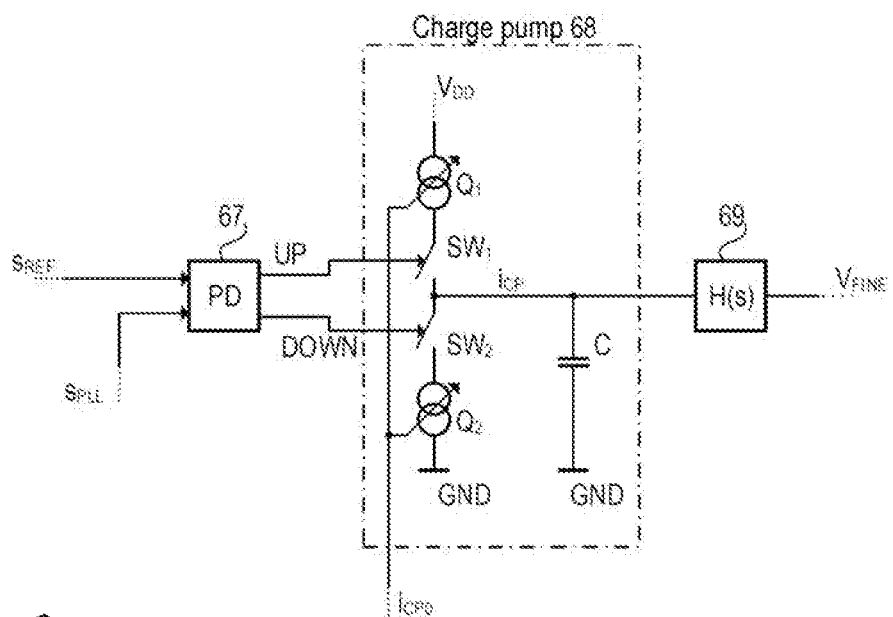
FIG. 9 illustrates an example implementation of a charge pump which can be used in the phase-locked loop according to FIG. 8.

FIG. 9 shows a simple example of a charge pump 68. The latter has a current source $Q_1$ and a second current sink $Q_2$ as well as a first switch $SW_1$ and a second switch $SW_2$. The switch $SW_1$ connects the current source $Q_1$ to an output node of the charge pump 68, and the switch $SW_2$ connects the current sink $Q_2$ to the output node. A capacitor C is coupled to the output node and is designed to store the charge provided by the current source $Q_1$ or the current sink $Q_2$. The voltage $V_{CP}$ across the capacitor C is proportional to the stored charge. The switches $SW_1$ and $SW_2$ of the charge pump 68 are controlled by the output signals UP, DOWN. If the phase of the signal $s_{PLL}(t)$ is smaller than the phase of the reference signal $s_{REF}(t)$, the switch $SW_1$ is switched on by the signal UP (for a particular switched-on time $T_{ON1}$) and the output current $i_{CP}$ of the charge pump is $+i_{CP0}$; the associated charge is $i_{CP0} \cdot T_{ON1}$. Equally, if the phase of the signal $s_{PLL}(t)$ is greater than the phase of the reference signal $s_{REF}(t)$, the switch $SW_2$ is switched on by the signal DOWN (for a particular switched-on time $T_{ON2}$) and the output current $i_{CP}$ of the charge pump is $-i_{CP0}$; the associated charge is $-i_{CP0} \cdot T_{ON2}$. The switched-on times $T_{ON1}$ and $T_{ON2}$ may be proportional to the respective phase difference (between $s_{PLL}(t)$ and $s_{REF}(t)$). The loop filter 69 filters the resulting voltage signal $V_{CP}$; the filtered signal is the fine tuning voltage $V_{FINE}$.

The structure and the function of the charge pump 68 are known per se and are therefore not explained any further here. Unlike in other implementations, the current source $Q_1$ and the current sink $Q_2$ are controllable, that is to say the absolute value $i_{CP0}$ of the output current is settable. As already explained above, the bandwidth of the phase-locked loop can be adjusted by changing the parameter $i_{CP0}$. As mentioned, the bandwidth of the phase-locked loop influences the phase noise which is contained in the LO signal $s_{LO}(t)$ and influences the noise floor of the radar system and therefore also the detectability of radar targets and the detection reliability. A radar sensor is designed to comply with particular specifications with respect to the phase noise. That is to say, a specified desired value for the maximum phase noise therefore also indirectly stipulates the (maximum) bandwidth of the phase-locked loop 60.

Since the differential VCO gain $k_{VCO} = \partial f_{LO}/\partial V_{FINE}$ depends on the frequency, the bandwidth of the phase-locked loop 60—and therefore also the phase noise—consequently changes, whereas, during the generation of a frequency ramp, the frequency $f_{LO}$ is varied (in accordance with the digital signal $x_{TUNE}[n]$). According to one example implementation, the differential VCO gain $k_{VCO}$ can be measured, for example at the starting frequency $f_1$ of a frequency ramp, and the bandwidth of the phase-locked loop 60 can be adjusted on the basis of the measured value in such a manner that the bandwidth does not exceed a specified value. This adjustment of the bandwidth can be achieved, for example, by changing the parameter $i_{CP0}$ of the charge pump 68. Additionally or alternatively, the transfer function H(s) of the loop filter 69 could also be adjusted, but this is comparatively difficult to achieve, whereas adjustment of the parameter $i_{CP0}$ is comparatively simple to implement.

Figure 10:
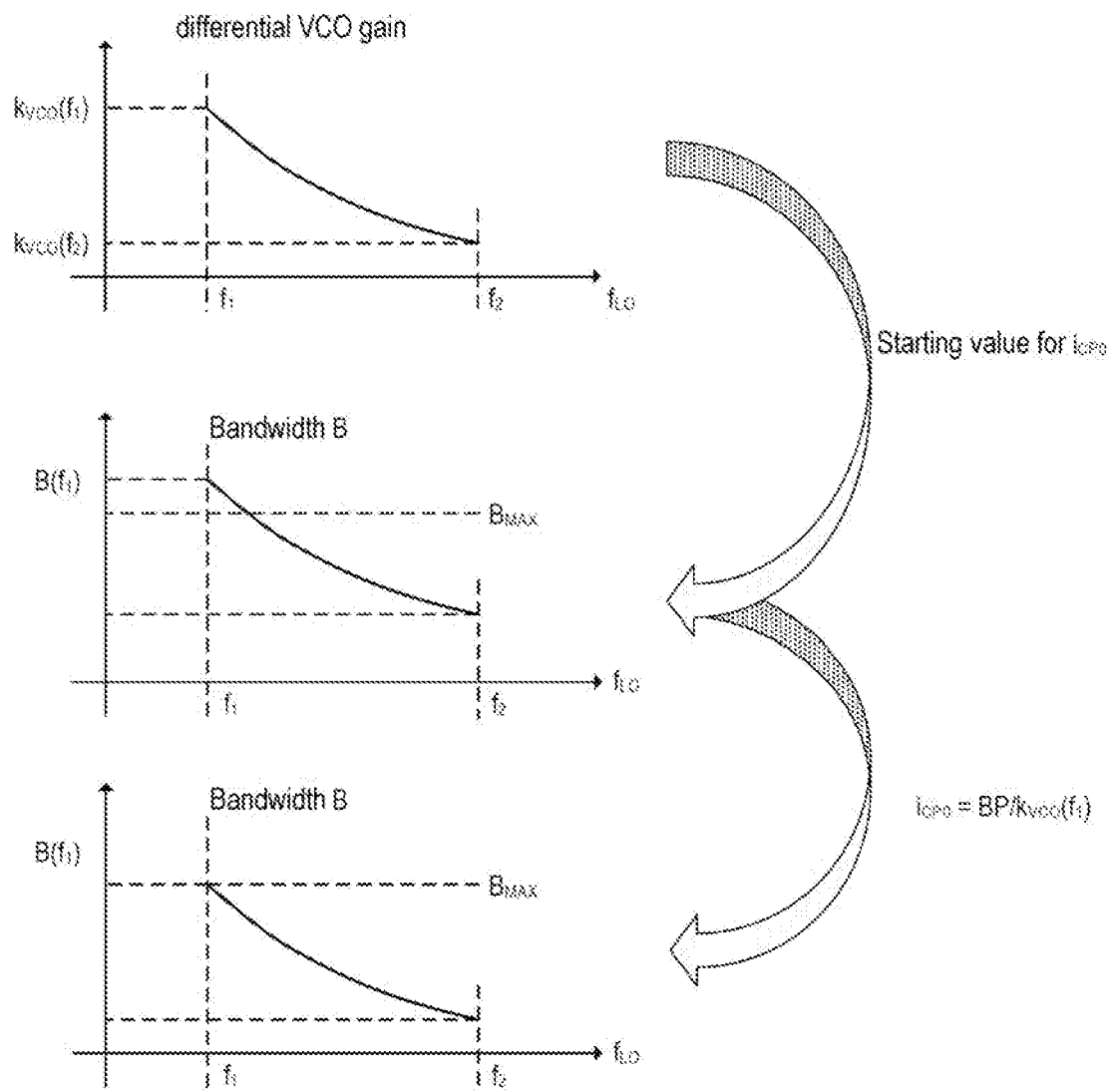
FIG. 10 illustrates the adjustment of the bandwidth of the phase-locked loop by changing the absolute value of the output current of the charge pump used in the phase-locked loop.

The graphs in FIG. 10 illustrate an example of the approach used in the example implementations described here for adjusting the bandwidth of the phase-locked loop. The first (uppermost) graph in FIG. 10 shows an example characteristic curve for illustrating the frequency dependence of the differential VCO gain $k_{VCO}$. According to the example illustrated here, the differential VCO gain $k_{VCO}$ falls with increasing frequency. That is to say, during the generation of a rising frequency ramp (up-chirp) with a starting frequency $f_1$ and a stop frequency $f_2$ ($f_2 > f_1$), the differential VCO gain $k_{VCO}$ falls from a first value $k_{VCO}(f_1)$ to a second (lower) value $k_{VCO}(f_2)$. Since—with a constant parameter $i_{CP0}$—the bandwidth is substantially proportional to the VCO gain, the bandwidth of the phase-locked loop falls during the up-chirp, as illustrated in the central and lower graphs in FIG. 10.

Situations may arise in which, during a frequency ramp, the bandwidth exceeds the bandwidth $B_{MAX}$ which denotes the maximum bandwidth (limit value) which is permissible for being able to comply with given specifications relating to the phase noise. One example of such a situation is illustrated in the central graph in FIG. 10. In order to avoid such situations and to avoid violation of the specification, the bandwidth of the phase-locked loop is adjusted according to the example implementations described here. According to the lower graph from FIG. 10, the bandwidth can be adjusted, for example, in such a manner that the maximum bandwidth ($B(f_1)$ in the case illustrated) corresponds exactly to the limit value $B_{MAX}$.

The bandwidth can be adjusted, for example, by defining a bandwidth parameter $$BP = k_{VCO} \cdot i_{CP0} \tag{3}$$

which is constant for the radar system and depends on the limit value $B_{MAX}$ or represents the latter. For example, the bandwidth parameter BP is proportional to the limit value $B_{MAX}$ (BP~$B_{MAX}$). The bandwidth parameter BP is stipulated during the system design and can be used to calculate the parameter $i_{CP0}$ on the basis of the VCO gain $\max\{k_{VCO}(f)\}$, in particular on the basis of the maximum (differential) VCO gain $\max\{k_{VCO}(f)\}$ for $f \in [f_1, f_2]$, which occurs during a frequency ramp. As already explained, the parameter $i_{CP0}$ determines the absolute value of the output current of the charge pump 68. That is to say, for the situation illustrated in the third graph in FIG. 10, $$i_{CP0} = \frac{BP}{\max\{k_{VCO}(f)\}} \text{ for } f \in [f_1, f_2]. \tag{4}$$

The maximum bandwidth of the phase-locked loop therefore depends directly on the bandwidth parameter BP. If (for example on account of a temperature change or a change in the starting frequency $f_1$) the maximum bandwidth $B(f_1)$ of the phase-locked loop (during a frequency ramp), and therefore also its performance with respect to the phase noise, changes, this change can be compensated for by adjusting the current of the charge pump 68 according to equation 4.

Figure 11:
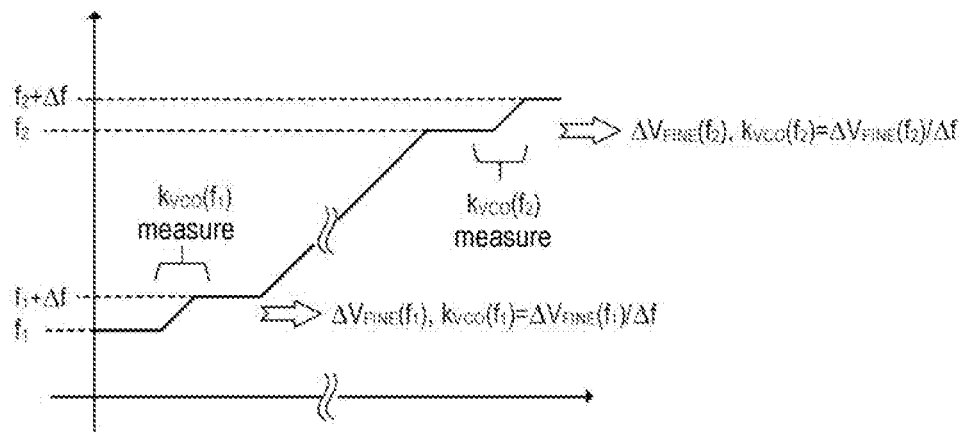
FIG. 11 illustrates an example timing diagram of the measurement of the VCO gain which is used to dynamically adjust the bandwidth of the phase-locked loop.

The procedure discussed above is explained in more detail in FIG. 11. FIG. 11 uses an example to show how a differential VCO gain $k_{VCO}(f)$ can be measured. In the present example, the differential VCO gain $k_{VCO}(f)$ is measured at the starting frequency $f_1$ and the stop frequency $f_2$ of a frequency ramp. Since the differential VCO gain $k_{VCO}(f)$ normally rises or falls monotonously during a frequency ramp (depending on the implementation of the VCO and on the direction of the frequency ramp, up-chirp or down-chirp), it may be sufficient to measure the differential VCO gain $k_{VCO}(f)$ only at one frequency, for example at the starting frequency (f1) of an up-chirp (cf. upper graph from FIG. 10). A measurement at both ends of the frequency ramp (that is to say at the starting frequency and the stop frequency) makes the scheme independent of the direction of the frequency ramp.

An up-chirp is considered in the example illustrated in FIG. 11, that is to say $f_2 > f_1$. The tuning explained above can first of all be carried out using successive approximation (cf. FIG. 6), but this is not compulsory. The frequency $f_{LO}$ of the LO signal $s_{LO}(t)$ is then set to the desired starting frequency $f_1$ (by appropriately setting the digital signal $x_{TUNE}[n]$) and the resulting voltage $V_{FINE}(f_1)$ set by the phase-locked loop 60 is measured (for example using the ADC 63 and the controller 50, see FIG. 5). The frequency $f_{LO}$ of the LO signal $s_{LO}(t)$ is then increased by a small frequency difference $\Delta f$ (for example by 50 MHz) and the resulting voltage $V_{FINE}(f_1 + \Delta f)$ is measured. Alternatively, the frequency can also be reduced by $\Delta f$. A measured value for the differential VCO gain $k_{VCO}(f_1)$ is obtained using the following approximation $$k_{VCO}(f_1) = \frac{\partial \Delta V_{FINE}}{\partial f}\bigg|_{f=f_1} \approx \frac{V_{FINE}(f_1 + \Delta f) - V_{FINE}(f_1)}{\Delta f} = \frac{\Delta V_{FINE}(f_1)}{\Delta f}. \quad (5)$$

This measurement can be repeated at the stop frequency $f_2$ of the frequency ramp. For a sufficiently good approximation, the frequency difference $\Delta f$ should be small in comparison with the modulation width $f_2 - f_1$ of the frequency ramp. In typical radar applications, the modulation width $f_2 - f_1$ is a few GHz for frequencies between 76 and 81 GHz, for example. The frequency difference $\Delta f$ can therefore be in the range of a few MHz (for example 10-100 MHz).

The bandwidth of the phase-locked loop can then be adjusted on the basis of the larger of the two measured values, that is to say on the basis of $k_{VCO,max} = \max\{k_{VCO}(f_1), k_{VCO}(f_2)\}$. This ensures that the bandwidth of the phase-locked loop does not become greater during a frequency ramp (irrespective of whether it is an up-chirp or down-chirp).

Figure 12:
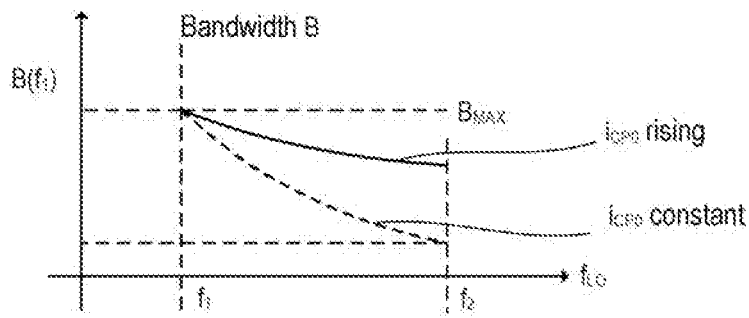
FIG. 12 illustrates a variant of the adjustment of the bandwidth according to FIG. 10 with an absolute value of the charge pump current which is variable during a frequency ramp.

As mentioned, the approach described above for adjusting the bandwidth takes into account the maximum value $k_{VCO,max}$ for the differential VCO gain $k_{VCO}(f)$ during a frequency ramp. This maximum differential VCO gain $k_{VCO,max}$ therefore determines the maximum bandwidth of the phase-locked loop which is set in such a manner that it is not higher than the limit value $B_{MAX}$ mentioned. However, in the example illustrated (FIG. 10, lower graph), the actual bandwidth falls during a frequency ramp and is mostly less than the limit value $B_{MAX}$. Although a lower bandwidth results in better performance with respect to the phase noise in the LO signal $s_{LO}(t)$, it also slows down the reaction speed of the local oscillator if the desired frequency (that is to say the value of the digital signal $x_{TUNE}[n]$, see FIG. 8) changes quickly. FIG. 12 shows a modification in which the absolute value $i_{CP0}$ of the output current $i_{CP}$ of the charge pump 68 is not constant during a frequency ramp, but rather rises with the frequency. The reduction in the bandwidth during an up-chirp is therefore at least partially compensated for. The rise in the absolute value $I_{CP0}$ does not overcompensate for the reduction in the differential VCO gain $k_{CP}(f)$ so that the bandwidth remains below the limit value $B_{MAX}$. If the change in the absolute value $i_{CP0}$ is exactly inverse to the change in the differential VCO gain $k_{VCO}(f)$, the bandwidth remains constant. This theoretical situation can only be approximately (but with sufficient accuracy) implemented in practice. In FIG. 12, the dashed line shows the profile of the bandwidth in the case of a constant absolute value $i_{CP0}$ of the charge pump current, as in the lower graph in FIG. 10, and the solid line shows a situation in which the absolute value $i_{CP0}$ of the charge pump current rises and therefore partially compensates for the reduction in the bandwidth.

Figure 13:
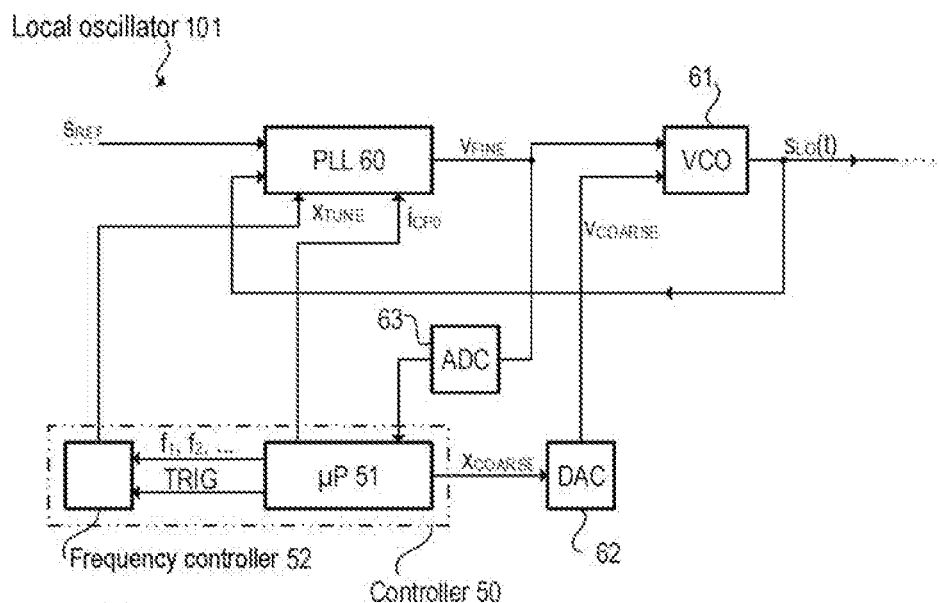
FIG. 13 is an example of a local oscillator having a phase-locked loop with a settable bandwidth.

FIG. 13 is a block diagram of an example of a local oscillator 101 which can have a similar structure to the local oscillator from FIG. 7, wherein coarse tuning is not absolutely necessary for the concepts of adjusting the bandwidth which are described here. The DAC 62 and the VCO input for the voltage $V_{COARSE}$ are therefore optional. Furthermore, the circuit from FIG. 13 comprises a controller 50 which is designed to measure the fine tuning voltage $V_{FINE}$ generated by the phase-locked loop (PLL) 60 using the analog/digital converter 63. In the example illustrated, the controller 50 has a microprocessor 51 and a frequency controller 52. The frequency controller 52 is designed to generate the digital signal $x_{TUNE}[n]$ for the phase-locked loop 60. As illustrated in the example from FIG. 8, the signal $x_{TUNE}[n]$ determines the effective division ratio R of the frequency divider(s) in the feedback path of the phase-locked loop and therefore the desired value for the oscillation frequency $f_{LO}$ of the VCO 61. The frequency controller 52 can receive various parameters from the microprocessor 51, for example ramp parameters such as the starting frequency $f_1$, the stop frequency $f_2$ and the duration of a chirp as well as one or more trigger signals TRIG for starting a chirp sequence.

In the example from FIG. 13, the controller 50 is also designed to adjust the bandwidth of the phase-locked loop 60 on the basis of one or more measurements of the (differential) VCO gain $k_{VCO}(f)$ for one or more frequencies. According to the example implementations described here, the bandwidth is adjusted by setting an operating parameter of the charge pump 68 arranged in the phase-locked loop 60, in particular by setting the absolute value of the output current $i_{CP0}$ of the charge pump. In other example implementations, the bandwidth of the phase-locked loop 60 can be adjusted by changing the transmission properties (transfer function H(s)) of the loop filter.

Figure 14:
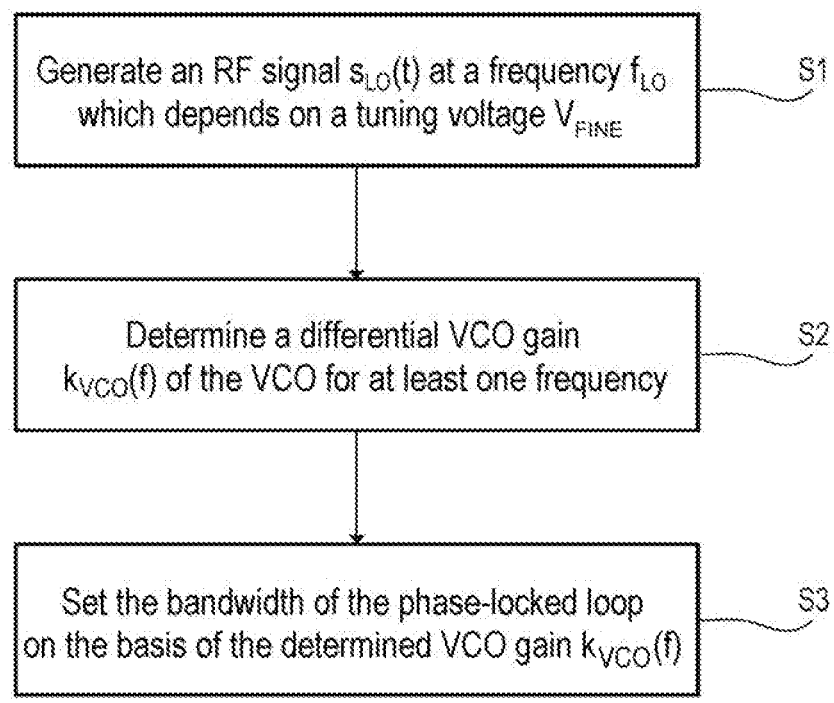
FIG. 14 is a flowchart for illustrating a method for adjusting the bandwidth of a local oscillator according to the example implementations described here.

FIG. 14 is a flowchart for illustrating a method for adjusting the bandwidth of a local oscillator according to the concepts described above on the basis of examples. According to FIG. 14, an RF signal $s_{LO}(t)$ is generated by a VCO (see, for example, FIG. 13, VCO 61). The frequency $f_{LO}$ of the RF signal $s_{LO}(t)$ depends on a tuning voltage $V_{FINE}$ (see FIG. 14, step S1). If coarse tuning was carried out in advance, the tuning voltage $V_{COARSE}$ can remain constant during this process. The tuning voltage $V_{FINE}$ is set by a phase-locked loop (see, for example, FIG. 13, PLL 60) coupled to the VCO in such a manner that the frequency $f_{LO}$ corresponds to a desired frequency. The desired frequency can be set, for example, using a fractional-N frequency divider (see FIG. 8, modulator 63, multi-modulus divider 66). For the frequency which has been set (for example a first frequency $f_1$) and optionally for further frequencies, the differential VCO gain $k_{VCO}(f_1)$ of the VCO is determined (see FIG. 14, step S2) and the bandwidth of the phase-locked loop is set on the basis of the determined differential VCO gain $k_{VCO}(f_1)$ (see FIG. 14, step S2).

The determination of the VCO gain $k_{VCO}(f_1)$ comprises changing the desired frequency (starting from a first frequency $f_1$) by a defined frequency difference $\Delta f$, whereupon the resulting change in the tuning voltage $V_{FINE}$ is measured. The VCO gain $kVCO(f_1)$ sought can be approximately determined on the basis of the change $\Delta V_{FINE}$ in the tuning voltage $V_{FINE}$ and the frequency difference $\Delta f$. The bandwidth of the phase-locked loop is adjusted, for example, by setting the absolute value $i_{CP0}$ of the output current of a charge pump contained in the phase-locked loop (see, for example, FIG. 9, charge pump 68).

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method comprising:
   generating a radio-frequency (RF) signal using a voltage-controlled oscillator (VCO),
      wherein a frequency of the RF signal depends on a first tuning voltage and a second tuning voltage,
   setting the second tuning voltage using a phase-locked loop coupled to the VCO to cause the frequency of the RF signal to correspond to a particular frequency,
   changing the first tuning voltage in such a manner that the second tuning voltage set by the phase-locked loop corresponds approximately to a predefined value,
   generating a chirp by changing the particular frequency, which results in a corresponding change in the second tuning voltage using the phase-locked loop,
      wherein the first tuning voltage remains constant during generation of the chirp,
   determining a differential VCO gain of the VCO for one or more values of the frequency of the RF signal, and
   adjusting a bandwidth of the phase-locked loop based on the differential VCO gain by setting an absolute value of an output current of a charge pump contained in the phase-locked loop.

2. The method as claimed in claim 1, wherein changing the first tuning voltage comprises varying the first tuning voltage according to an iteration scheme.

3. The method as claimed in claim 1, wherein, after the first tuning voltage has been changed, the second tuning voltage is regulated using the phase-locked loop in such a manner that the frequency of the RF signal is adjusted to the particular frequency.

4. The method as claimed in claim 1, further comprising:
   changing the particular frequency by a defined frequency difference, while the first tuning voltage remains unchanged,
   measuring a resulting change in the second tuning voltage, and
   wherein adjusting the bandwidth of the phase-locked loop comprises:
      adjusting the bandwidth of the phase-locked loop based on the defined frequency difference and the resulting change in the second tuning voltage.

5. The method as claimed in claim 1, further comprising: converting a digital word to generate the first tuning voltage.

6. A method comprising:
   generating a radio-frequency (RF) signal using a voltage-controlled oscillator (VCO),
      wherein a frequency of the RF signal depends on a tuning voltage,
   setting the tuning voltage using a phase-locked loop coupled to the VCO to cause the frequency of the RF signal to correspond to a particular frequency,
   determining a differential VCO gain of the VCO by:
      changing the particular frequency by a defined frequency difference,
      measuring a resulting change in the tuning voltage, and
      determining the differential VCO gain based on the resulting change in the tuning voltage and the defined frequency difference,
   setting a bandwidth of the phase-locked loop based on the differential VCO gain by setting an absolute value of an output current of a charge pump contained in the phase-locked loop, and
   changing the absolute value of the output current to change the bandwidth of the phase-locked loop.

7. The method as claimed in claim 6, further comprising:
   generating a chirp by changing the particular frequency, which results in a corresponding change in the tuning voltage using the phase-locked loop.

8. The method as claimed in claim 6, wherein the tuning voltage is a sum of a first tuning voltage and a second tuning voltage.

9. A radio-frequency (RF) oscillator circuit comprising:
   a voltage-controlled oscillator (VCO) configured to generate an RF signal,
      wherein a frequency of the RF signal depends on a first tuning voltage and a second tuning voltage,
   a phase-locked loop coupled to the VCO and configured to set the second tuning voltage in such a manner that the frequency of the RF signal corresponds to a particular frequency,
      wherein the phase-locked loop has a charge pump, and
   a control circuit configured to set the first tuning voltage in such a manner that the second tuning voltage set by the phase-locked loop corresponds approximately to a predefined value,
      wherein the control circuit is configured to:
         change the particular frequency by a defined frequency difference while the first tuning voltage remains changed and to determine a resulting change in the second tuning voltage,
         generate a control signal for the phase-locked loop based on the change in the second tuning voltage and the defined frequency difference,
            wherein a bandwidth of the phase-locked loop depends on the control signal, and
         determine an absolute value of an output current of the charge pump.

10. The RF oscillator circuit as claimed in claim 9, further comprising:
    a digital-to-analog converter configured to:
       receive a digital signal from the control circuit, and
       generate a corresponding analog signal which determines the first tuning voltage.

11. The RF oscillator circuit as claimed in claim 9, wherein, in order to set the first tuning voltage, the control circuit is configured to iteratively change the first tuning voltage until the second tuning voltage corresponds approximately to the predefined value.

12. The RF oscillator circuit as claimed in claim 9, wherein, in order to generate a chirp, the control circuit is configured to set and change the particular frequency in accordance with predefined parameters.

13. The RF oscillator circuit as claimed in claim 9, wherein the control circuit is further configured to:
   determine a VCO gain based on a frequency difference and the resulting change in the second tuning voltage, and
   adjust the bandwidth of the phase-locked loop based on the VCO gain.

14. The RF oscillator circuit as claimed in claim 9, wherein the VCO is further configured to:
   receive the first tuning voltage from a digital-to-analog converter, and
   receive the second tuning voltage from the phase-locked loop.

15. The RF oscillator circuit as claimed in claim 9, further comprising:
   an analog-to-digital converter configured to:
      receive the second tuning voltage, and
      generate a digital value based on the second tuning voltage.

16. A radio-frequency (RF) oscillator circuit comprising:
   a voltage-controlled oscillator (VCO) configured to generate an RF signal,
      wherein a frequency of the RF signal depends on a tuning voltage,
   a phase-locked loop coupled to the VCO and configured to set the tuning voltage in such a manner that the frequency of the RF signal corresponds to a particular frequency,
      wherein the phase-locked loop has a charge pump having an output current with an absolute value that is settable, and
   a control circuit coupled to the phase-locked loop and configured to:
      determine a differential VCO gain of the VCO,
      set a bandwidth of the phase-locked loop based on the differential VCO gain, and change the absolute value of the output current in order to set the bandwidth of the phase-locked loop.

17. The RF oscillator circuit as claimed in claim 16, wherein the control circuit is further configured to:
   change the particular frequency by a defined frequency difference and determine a resulting change in the tuning voltage, and
   determine the differential VCO gain for the particular frequency based on the resulting change and the defined frequency difference.

18. The RF oscillator circuit as claimed in claim 16, wherein the tuning voltage is a sum of a first tuning voltage and a second tuning voltage.

19. The RF oscillator circuit as claimed in claim 18, further comprising:
   a digital-to-analog converter configured to:
      receive a digital signal from the control circuit, and
      generate a corresponding analog signal which determines the first tuning voltage.

20. The RF oscillator circuit as claimed in claim 18, further comprising:
   an analog-to-digital converter configured to:
      receive the second tuning voltage, and
      generate a digital value based on the second tuning voltage.

* * * * *